US008522490B1

(12) United States Patent
Stancel (10) Patent No.: US 8,522,490 B1
(45) Date of Patent: Sep. 3, 2013

(54) SOLAR MODULE MOUNTING APPARATUS ALLOWING FOR AT LEAST ONE DEGREE OF FREEDOM

(75) Inventor: Robert Stancel, Los Altos Hills, CA (US)

(73) Assignee: Nanosolar, Inc., San Jose, CA (US)

( * ) Notice: Subject to any disclaimer, the term of this patent is extended or adjusted under 35 U.S.C. 154(b) by 0 days.

(21) Appl. No.: 12/483,226

(22) Filed: Jun. 11, 2009

Related U.S. Application Data

(60) Provisional application No. 61/060,793, filed on Jun. 11, 2008.

(51) Int. Cl.
*E04D 13/18* (2006.01)
*F16C 11/06* (2006.01)

(52) U.S. Cl.
USPC ............... 52/173.3; 136/251; 248/222.52; 403/114

(58) Field of Classification Search
USPC ............... 52/173.3; 136/244, 251; 126/623; 248/121, 125.7, 125.9, 220.22, 222.52, 288.11, 248/288.31
See application file for complete search history.

(56) References Cited

U.S. PATENT DOCUMENTS

| | | | | | |
|---|---|---|---|---|---|
| 1,682,442 | A | * | 8/1928 | Thomas | 403/121 |
| 3,286,516 | A | * | 11/1966 | Post | 73/853 |
| 3,539,234 | A | * | 11/1970 | Rapata | 384/203 |
| 3,815,303 | A | * | 6/1974 | Ziegler | 52/99 |
| 3,880,396 | A | * | 4/1975 | Freiberger et al. | 248/475.1 |
| 4,306,540 | A | * | 12/1981 | Hutchison | 126/607 |
| 4,371,139 | A | * | 2/1983 | Clark | 248/237 |
| 4,404,962 | A | * | 9/1983 | Zinn et al. | 126/676 |
| 4,409,758 | A | * | 10/1983 | Dickerson et al. | 49/463 |
| 4,637,178 | A | * | 1/1987 | Nimmo et al. | 52/36.4 |
| 5,112,408 | A | * | 5/1992 | Melchior | 136/251 |
| 5,252,141 | A | * | 10/1993 | Inoue et al. | 136/251 |
| 5,460,660 | A | * | 10/1995 | Albright et al. | 136/251 |
| 5,678,383 | A | * | 10/1997 | Danielewicz | 52/775 |
| 5,768,831 | A | * | 6/1998 | Melchior | 52/173.3 |
| 5,986,203 | A | * | 11/1999 | Hanoka et al. | 136/251 |
| 6,046,399 | A | * | 4/2000 | Kapner | 136/244 |
| 6,093,884 | A | * | 7/2000 | Toyomura et al. | 136/244 |
| 6,170,197 | B1 | * | 1/2001 | Tyves et al. | 49/375 |
| 6,294,724 | B1 | * | 9/2001 | Sasaoka et al. | 136/251 |
| 6,338,223 | B1 | * | 1/2002 | Stahl | 49/463 |
| 6,546,988 | B2 | * | 4/2003 | Stahl | 160/87 |
| 6,651,388 | B1 | * | 11/2003 | Scheck | 49/375 |
| 6,810,937 | B2 | * | 11/2004 | Stahl | 160/87 |
| 6,959,517 | B2 | * | 11/2005 | Poddany et al. | 52/173.3 |
| 7,384,209 | B2 | * | 6/2008 | Muders et al. | 403/115 |
| 7,435,897 | B2 | * | 10/2008 | Russell | 136/244 |
| 7,557,291 | B2 | * | 7/2009 | Flaherty et al. | 136/244 |
| 7,574,842 | B2 | * | 8/2009 | Russell | 52/768 |
| 7,730,676 | B2 | * | 6/2010 | Hon | 52/173.3 |

(Continued)

FOREIGN PATENT DOCUMENTS
GB 2064756 A * 6/1981

*Primary Examiner* — Robert Canfield
*Assistant Examiner* — Brent W Herring
(74) *Attorney, Agent, or Firm* — Joshua D. Isenberg; JDI Patent (57) ABSTRACT

Methods and devices are provided for rapid solar module installation. In one embodiment, a photovoltaic module is provided comprising of a plurality of photovoltaic cells positioned between a transparent module layer and a backside module layer. The module may be a frameless module. The module may have brackets that allow one degree of freedom. Optionally, the module may have brackets that allow the module to flex in at least one axis of rotation.

12 Claims, 8 Drawing Sheets

(56) References Cited

U.S. PATENT DOCUMENTS

| | | | |
|---|---|---|---|
| 7,797,882 B2* | 9/2010 | Lubaway | 49/352 |
| 2005/0115176 A1* | 6/2005 | Russell | 52/220.1 |
| 2005/0126622 A1* | 6/2005 | Mukai et al. | 136/251 |
| 2006/0048452 A1* | 3/2006 | Sweeney et al. | 49/374 |
| 2008/0040990 A1* | 2/2008 | Vendig et al. | 52/173.3 |
| 2008/0149169 A1* | 6/2008 | Flaherty et al. | 136/251 |
| 2009/0242014 A1* | 10/2009 | Leary | 136/251 |
| 2009/0266352 A1* | 10/2009 | Wetmore | 126/571 |
| 2010/0108113 A1* | 5/2010 | Taggart et al. | 135/96 |
| 2010/0154784 A1* | 6/2010 | King et al. | 126/623 |
| 2010/0218441 A1* | 9/2010 | Stancel et al. | 52/173.3 |
| 2010/0263296 A1* | 10/2010 | Jones | 52/1 |

\* cited by examiner

SOLAR MODULE MOUNTING APPARATUS ALLOWING FOR AT LEAST ONE DEGREE OF FREEDOM

CROSS-REFERENCE TO RELATED APPLICATION

This application claims priority to U.S. Provisional Application Ser. No. 61/060,793 filed Jun. 11, 2008 and fully incorporated herein by reference for all purposes.

FIELD OF THE INVENTION

This invention relates generally to photovoltaic devices, and more specifically, to a mounting apparatus for solar cells and/or solar cell modules designed for large-scale electric power generating installations.

BACKGROUND OF THE INVENTION

Solar cells and solar cell modules convert sunlight into electricity. Traditional solar cell modules are typically comprised of polycrystalline and/or monocrystalline silicon solar cells mounted on a support with a rigid glass top layer to provide environmental and structural protection to the underlying silicon based cells. This package is then typically mounted in a rigid aluminum or metal frame that supports the glass and provides attachment points for securing the solar module to the installation site. A host of other materials are also included to make the solar module functional. This may include junction boxes, bypass diodes, sealants, and/or multi-contact connectors used to complete the module and allow for electrical connection to other solar modules and/or electrical devices. Certainly, the use of traditional silicon solar cells with conventional module packaging is a safe, conservative choice based on well understood technology.

Drawbacks associated with traditional solar module package designs, however, have limited the ability to install large numbers of solar panels in a cost-effective manner. This is particularly true for large scale deployments where it is desirable to have large numbers of solar modules setup in a defined, dedicated area. Traditional solar module packaging comes with a great deal of redundancy and excess equipment cost. For example, a recent installation of conventional solar modules in Pocking, Germany deployed 57,912 monocrystalline and polycrystalline-based solar modules. This meant that there were also 57,912 junction boxes, 57,912 aluminum frames, untold meters of cablings, and numerous other components. These traditional module designs inherit a large number of legacy parts that hamper the ability of installers to rapidly and cost-efficiently deploy solar modules at a large scale.

Although subsidies and incentives have created some large solar-based electric power installations, the potential for greater numbers of these large solar-based electric power installations has not been fully realized. There remains substantial improvement that can be made to photovoltaic cells and photovoltaic modules that can greatly increase their ease of installation, and create much greater market penetration and commercial adoption of such products.

SUMMARY OF THE INVENTION

Embodiments of the present invention address at least some of the drawbacks set forth above. The present invention provides for the improved solar module designs that reduce manufacturing costs and redundant parts in each module. These improved module designs are well suited for rapid installation. It should be understood that at least some embodiments of the present invention may be applicable to any type of solar cell, whether they are rigid or flexible in nature or the type of material used in the absorber layer. Embodiments of the present invention may be adaptable for roll-to-roll and/or batch manufacturing processes. At least some of these and other objectives described herein will be met by various embodiments of the present invention.

A further understanding of the nature and advantages of the invention will become apparent by reference to the remaining portions of the specification and drawings.

DESCRIPTION OF THE SPECIFIC EMBODIMENTS

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings "Optional" or "optionally" means that the subsequently described circumstance may or may not occur, so that the description includes instances where the circumstance occurs and instances where it does not. For example, if a device optionally contains a feature for an anti-reflective film, this means that the anti-reflective film feature may or may not be present, and, thus, the description includes both structures wherein a device possesses the anti-reflective film feature and structures wherein the anti-reflective film feature is not present.

Photovoltaic Module

Figure 1:
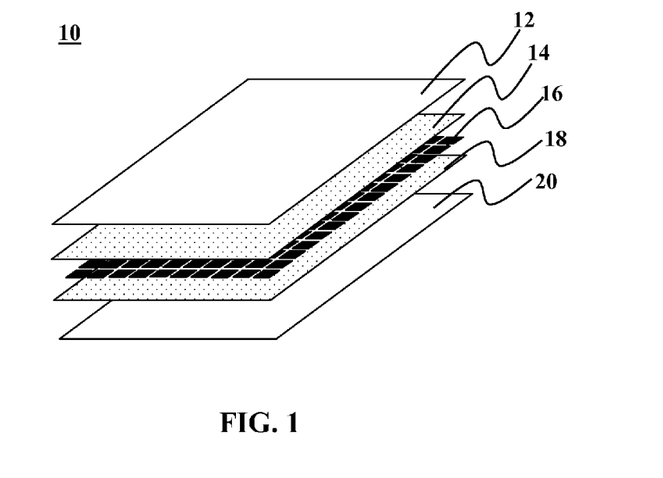
FIG. 1 is an exploded perspective view of a module according to one embodiment of the present invention.

Referring now to FIG. 1, one embodiment of a module 10 according to the present invention will now be described. Traditional module packaging and system components were developed in the context of legacy cell technology and cost economics, which had previously led to very different panel and system design assumptions than those suited for increased product adoption and market penetration. The cost structure of solar modules includes both factors that scale with area and factors that are fixed per module. Module 10 is designed to minimize fixed cost per module and decrease the incremental cost of having more modules while maintaining substantially equivalent qualities in power conversion and module durability. In this present embodiment, the module 10 may include improvements to the backsheet, frame modifications, thickness modifications, and electrical connection modifications.

FIG. 1 shows that the present embodiment of module 10 may include a rigid transparent upper layer 12 followed by a pottant layer 14 and a plurality of solar cells 16. Below the layer of solar cells 16, there may be another pottant layer 18 of similar material to that found in pottant layer 14. Beneath the pottant layer 18 may be a layer of backsheet material 20. The transparent upper layer 12 may provide structural support and/or act as a protective barrier. By way of nonlimiting example, the transparent upper layer 12 may be a glass layer comprised of materials such as conventional glass, solar glass, high-light transmission glass with low iron content, standard light transmission glass with standard iron content, anti-glare finish glass, glass with a stippled surface, fully tempered glass, heat-strengthened glass, annealed glass, or combinations thereof. By way of example and not limitation, the total thickness of the glass or multi-layer glass may be in the range of about 2.0 mm to about 13.0 mm, optionally from about 2.8 mm to about 12.0 mm. Some embodiments may have even thinner glass, such as from 0.1-1.0 mm. In one embodiment, the top layer 12 has a thickness of about 3.2 mm. In another embodiment, the backlayer 20 has a thickness of about 2.0 mm. As a nonlimiting example, the pottant layer 14 may be any of a variety of pottant materials such as but not limited to Tefzel®, ethyl vinyl acetate (EVA), polyvinyl butyral (PVB), ionomer, silicone, thermoplastic polyurethane (TPU), thermoplastic elastomer polyolefin (TPO), tetrafluoroethylene hexafluoropropylene vinylidene (THV), fluorinated ethylene-propylene (FEP), saturated rubber, butyl rubber, thermoplastic elastomer (TPE), flexibilized epoxy, epoxy, amorphous polyethylene terephthalate (PET), urethane acrylic, acrylic, other fluoroelastomers, other materials of similar qualities, or combinations thereof. Optionally, some embodiments may have more than two pottant layers. The thickness of a pottant layer may be in the range of about 10 microns to about 1000 microns, optionally between about 25 microns to about 500 microns, and optionally between about 50 to about 250 microns. Others may have only one pottant layer (either layer 14 or layer 16). In one embodiment, the pottant layer 14 is about 75 microns in cross-sectional thickness. In another embodiment, the pottant layer 14 is about 50 microns in cross-sectional thickness. In yet another embodiment, the pottant layer 14 is about 25 microns in cross-sectional thickness. In a still further embodiment, the pottant layer 14 is about 10 microns in cross-sectional thickness. The pottant layer 14 may be solution coated over the cells or optionally applied as a sheet that is laid over cells under the transparent module layer 12.

It should be understood that the simplified module 10 is not limited to any particular type of solar cell. The solar cells 16 may be silicon-based or non-silicon based solar cells. By way of nonlimiting example the solar cells 16 may have absorber layers comprised of silicon (monocrystalline or polycrystalline), amorphous silicon, organic oligomers or polymers (for organic solar cells), bi-layers or interpenetrating layers or inorganic and organic materials (for hybrid organic/inorganic solar cells), dye-sensitized titania nanoparticles in a liquid or gel-based electrolyte (for Graetzel cells in which an optically transparent film comprised of titanium dioxide particles a few nanometers in size is coated with a monolayer of charge transfer dye to sensitize the film for light harvesting), copper-indium-gallium-selenium (for CIGS solar cells), CdSe, CdTe, $Cu(In,Ga)(S,Se)_2$, $Cu(In,Ga,Al)(S,Se,Te)_2$, and/or combinations of the above, where the active materials are present in any of several forms including but not limited to bulk materials, micro-particles, nano-particles, or quantum dots. Advantageously, thin-film solar cells have a substantially reduced thickness as compared to silicon-based cells. The decreased thickness and concurrent reduction in weight allows thin-film cells to form modules that are significantly thinner than silicon-based cells without substantial reduction in structural integrity (for modules of similar design).

The pottant layer 18 may be any of a variety of pottant materials such as but not limited to EVA, Tefzel®, PVB, ionomer, silicone, TPU, TPO, THV, FEP, saturated rubber, butyl rubber, TPE, flexibilized epoxy, epoxy, amorphous PET, urethane acrylic, acrylic, other fluoroelastomers, other materials of similar qualities, or combinations thereof as previously described for FIG. 1. The pottant layer 18 may be the same or different from the pottant layer 14. Further details about the pottant and other protective layers can be found in commonly assigned, co-pending U.S. patent application Ser. No. 11/462,359 filed Aug. 3, 2006 and fully incorporated herein by reference for all purposes. Further details on a heat sink coupled to the module can be found in commonly assigned, co-pending U.S. patent application Ser. No. 11/465,783 filed Aug. 18, 2006 and fully incorporated herein by reference for all purposes.

Figure 2:
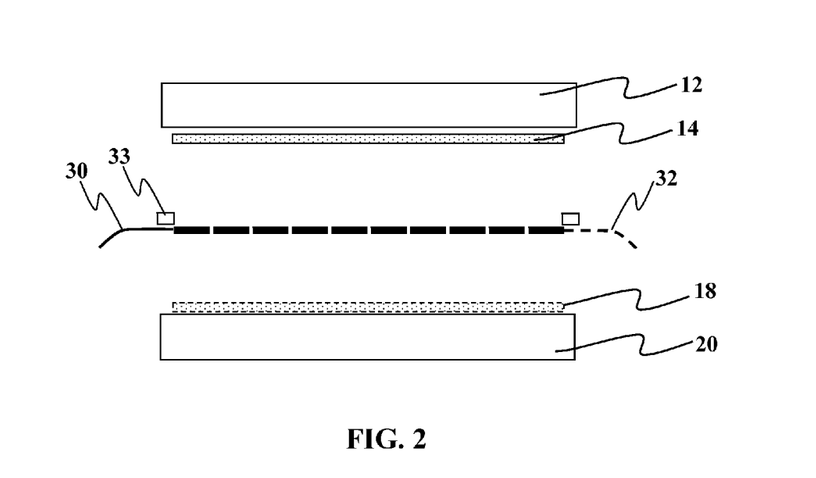
FIG. 2 shows a side view of a module according to one embodiment of the present invention.

FIG. 2 shows a cross-sectional view of the module of FIG. 1. By way of nonlimiting example, the thicknesses of backsheet 20 may be in the range of about 10 microns to about 1000 microns, optionally about 20 microns to about 500 microns, or optionally about 25 to 250 microns. Again, as seen for FIG. 2, this embodiment of module 10 is a frameless module without a central junction box. The present embodiment may use a simplified backsheet 20 that provides protective qualities to the underside of the module 10. As seen in FIG. 1, the module may use a rigid backsheet 20 comprised of a material such as but not limited to annealed glass, heat strengthened glass, tempered glass, flow glass, cast glass, or similar materials as previously mentioned. The rigid backsheet 20 may be made of the same or different glass used to form the upper transparent module layer 12. Optionally, in such a configuration, the top sheet 12 may be a flexible top sheet such as that set forth in U.S. patent application Ser. No. 11/770,611 filed Jun. 28, 2007 and fully incorporated herein by reference for all purposes. In one embodiment, electrical connectors 30 and 32 may be used to electrically couple cells to other modules or devices outside the module 10. A moisture barrier material 33 may also be included along a portion or all of the perimeter of the module.

Module Support System

Figure 3:
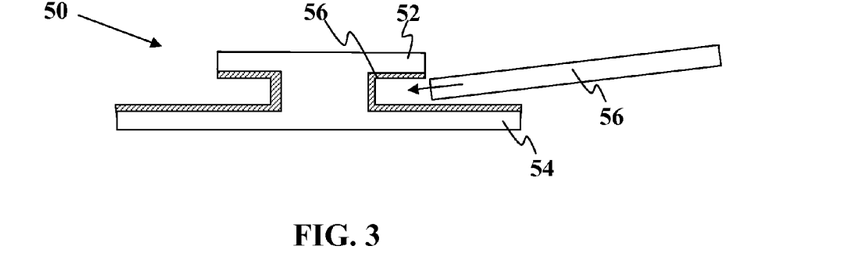
FIG. 3 shows a module mounting support for one embodiment of the present invention.

Referring now to FIG. 3, one embodiment of a mounting clip 50 will now be described. Clip 50 is shown in cross-section. Clip 50 is asymmetric with a shorter top portion 52 and a longer bottom portion 54. The longer bottom portion 54 provides for greater underside support to the module. The longer bottom portion 54 also provides more area of the module to slide against the clip and help guide the module into position. All or a portion of the receiving area in clip 50 may be coated with a cushion area 56 to provide for reduced risk of damage to module 58. In this present embodiment, each clip 50 may engage two different modules (one on each side).

Figure 4:
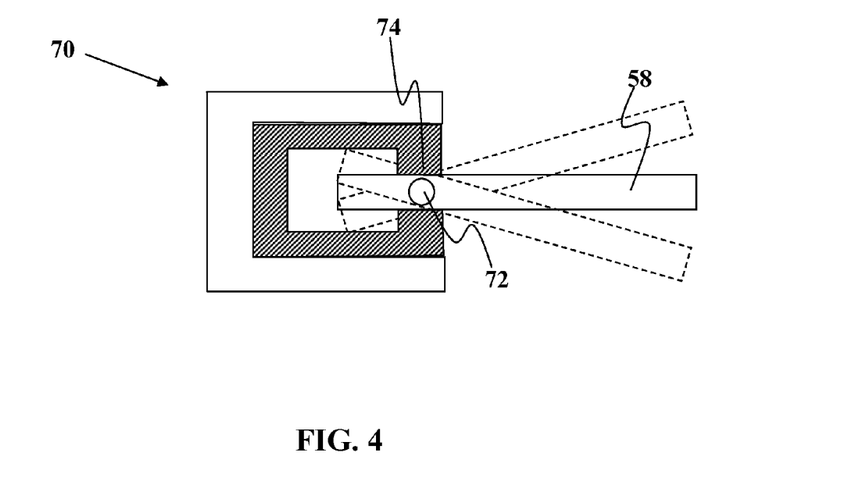
FIG. 4 shows a module mounting support with one degree of freedom according to one embodiment of the present invention.

FIG. 4 shows another embodiment of an attachment clip 70 wherein the clip 70 is designed to allow the module 58 to pivot around a point 72. This may be accomplished by have a polymeric or other jaw 74 which engages the module, but in a manner that is sufficiently compliant to allow for up to 30 degrees of up or down swing relative to horizontal. Optionally, another embodiment of the present invention only allows for up to 20 degrees of up or down swing relative to horizontal. Optionally, another embodiment of the present invention only allows for up to 15 degrees of up or down swing relative to horizontal. Optionally, another embodiment of the present invention only allows for up to 10 degrees of up or down swing relative to horizontal. The inside end of the module will contact the upper (or lower) surface in the bracket to limit maximum rotation.

Figure 5:
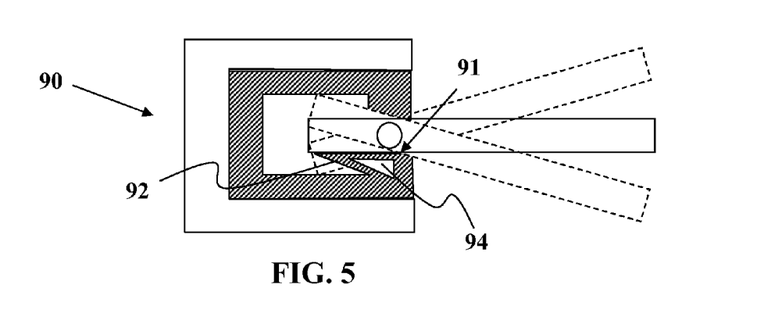
FIGS. 5-6 show module mounting supports with one degree of freedom according to various embodiments of the present invention.

FIG. 5 shows yet another embodiment of a mounting clip 90 wherein the lower jaw 91 has a longer inner portion 92 and may optionally include a hollowed portion 94 to allow for greater cushioning or pliability. This allows for easy installation that allow for the module to be slid into the clip and be held in place by a second opposing clip that will slide in to prevent module pull out since the opposing clips (see FIG. 13) will prevent slide out due to the opposing nature of the clips.

Figure 6:
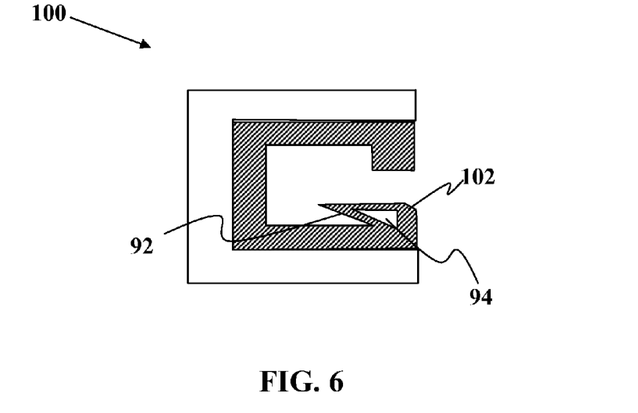

FIG. 6 shows a clip 100 similar to that of FIG. 5, with a rounded or shaped leading edge 102 to allow for flexing of the module. Optionally, it is the top jaw or both jaws that have this configuration. The material may be sandwiched with a rigid outer material for support with a softer polymeric or other material that actually engages the glass or other surface of the module.

Figure 7:
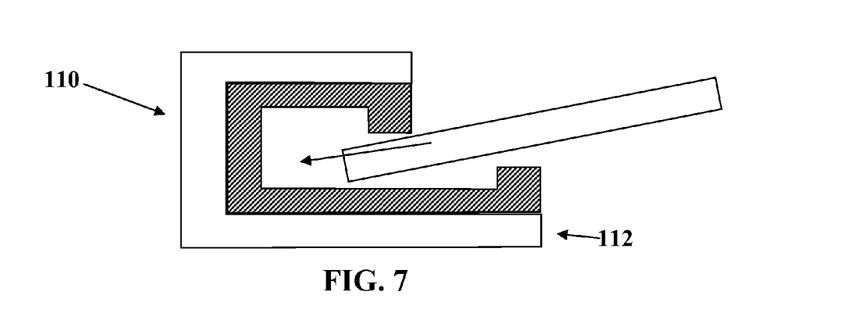
FIGS. 7-9 show module mounting supports with one degree of freedom according to various embodiments of the present invention.

FIG. 7 shows yet another embodiment of a clip 110 wherein the clip includes jaws, but the design also has an symmetric feature wherein the lower portion 112 is longer to allow for the module to slide in more easily. This embodiment may be secured to resist module pull out in the lateral direction, but allow for upward angling of the module. It also provides greater backside support without shading the front side of the module.

Figure 8:
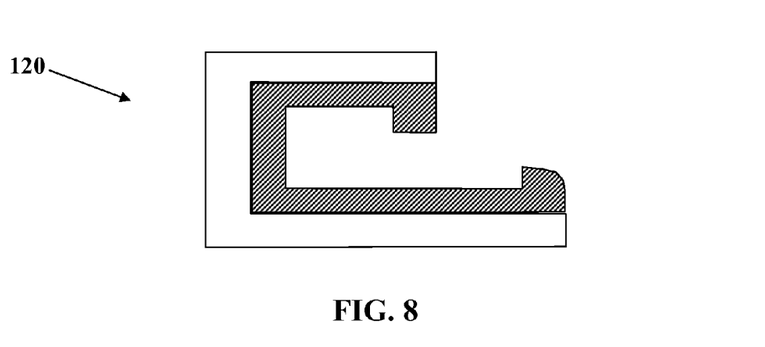

FIG. 8 shows a clip 120 similar to that of FIG. 7, except that the jaw has a rounded tip.

Figure 9:
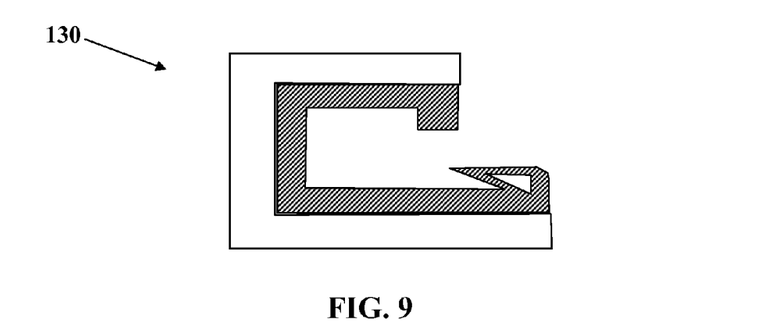

FIG. 9 shows another embodiment of the clip 130 wherein there is both a rounded tip and a hollow portion with a portion that extends back towards the interior.

Figure 10:
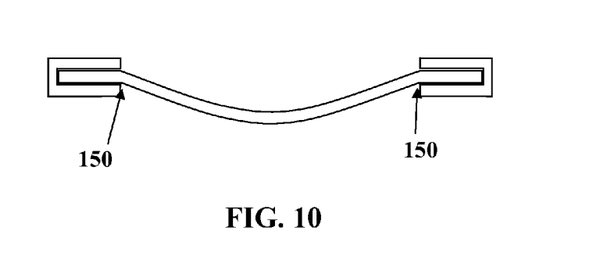
FIG. 10 shows a side view of a rigidly mounted module
Figure 11:
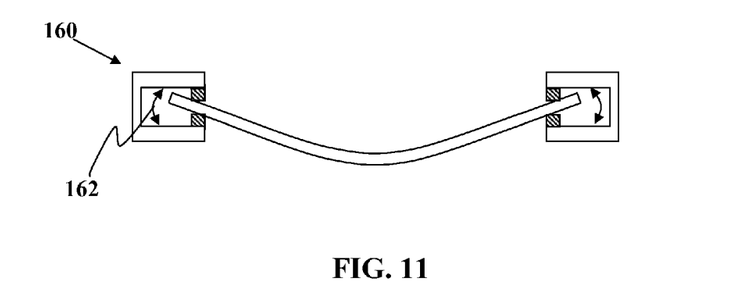
FIGS. 11-12 show modules mounted that allow for one degree of freedom while withstanding lateral forces without pulling out according to embodiments of the present invention.
Figure 12:
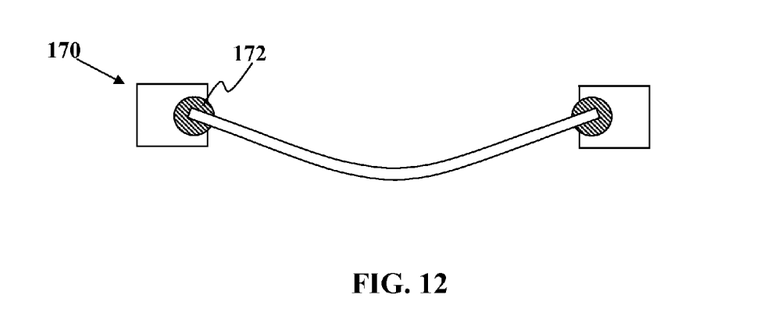

Referring now to FIGS. 10-12, yet another aspect of the present invention will now be described. FIG. 10 shows that rigid clipping/mounting may cause high stress concentrations at positions 150. FIG. 11 shows how having a clip 160 that allows the module to mounted in a pivotable configuration allows for stress relief at the locations 150. The clip 160 of FIG. 11 provides for sufficient clearance inside the clip to allow for the edge of the modules to move therein as indicated by arrow 162. This embodiment may provide compressive forces on the module that prevents lateral pullout, but still simultaneously allow for rotation upward and/or downward of the module to account for snow load or upward for wind load without lateral pullout from the module. This may be clamping force, by adhesive, or other attachment method that allows for rotation but simultaneously not pullout. The module may itself be roughed or textured in any of the embodiments herein to provide better engagement with the module clips or brackets. Some embodiments may have stops that allow for maximum of 1 inch of maximum vertical deflection. Some embodiments may have stops that allow for maximum of 2 inches of maximum vertical deflection. Some embodiments may have stops that allow for maximum of 3 inches of maximum vertical deflection. Some embodiments may have stops that allow for maximum of 4 inches of maximum vertical deflection. Some embodiments may have stops that allow for up to 90% of deflection before the panel breaks or tears out of the brackets. Some embodiments may have stops that allow for up to 80% of deflection before the panel breaks or tears out of the brackets. Some embodiments may have stops that allow for up to 70% of deflection before the panel breaks or tears out of the brackets. Some embodiments may have stops that allow for up to 50% of deflection before the panel breaks or tears out of the brackets. Some embodiments may have stops that allow for up to 50% of deflection before the panel breaks or tears out of the brackets.

FIG. 12 shows that in some embodiments, the modules may be molded or otherwise attached into rotatable bushings 172 that can rotate inside cutouts of the clips 170. In this manner, the module may be held very firmly by the bushings 172 in a manner that resists lateral pullout forces, but simultaneously still allows for rotation about a horizontal axis. Some embodiments may use hinges that have one end rigidly attached by clamping or other feature to the hinge. This type of flexibility in one axis prevents stress concentrations that may otherwise break the glass module. This allows the module to withstand increased snow load or wind load without breaking. The hinges may also be pre-set not to start rotating until a pre-determined load is reached. Thus, in most embodiments, the bracket will hold the module flat in a horizontal plane until a threshold pressure is reached. This preset allows for the load to be carried in the glass of the module to a certain point and then the bracket will allow for motion or rotation to allow for more load without breaking the module. Some embodiments allow for ½ of the module stress concentration until failure to be reached before the bracket allows for rotation or motion. Optionally, some embodiments allow for ⅛ of the module stress concentration until failure to be reached before the bracket allows for rotation or motion. Optionally, some embodiments allow for ¼ of the module stress concentration until failure to be reached before the bracket allows for rotation or motion. Optionally, some embodiments allow for ¾ of the module stress concentration until failure to be reached before the bracket allows for rotation or motion. The preset may be configured into the bracket by way of resistance in the bracket to prevent motion until a certain psi of pressure is reached. Some embodiments have a 500 psi pressure before motion is allowed. Optionally, some embodiments have a 750 psi pressure before motion is allowed. Optionally, some embodiments have a 1000 psi pressure before motion is allowed. Optionally, some embodiments have a 1250 psi pressure before motion is allowed. Optionally, some embodiments have a 1500 psi pressure before motion is allowed. Optionally, some embodiments have a 2000 psi pressure before motion is allowed. Optionally, some embodiments have a 2400 psi pressure before motion is allowed. Any of the embodiments herein may be preset to have these minimum pressures before motion is allowed. Some embodiments allow only one degree of freedom and no more.

Figure 13:
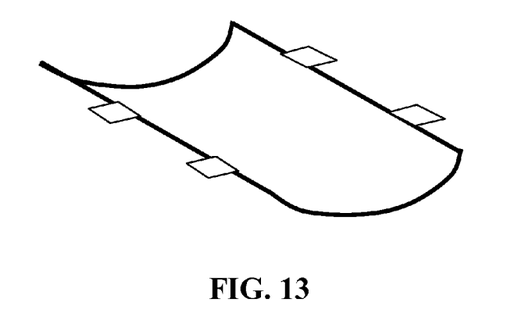
FIGS. 13-14 show deflection modes according to various embodiments to the present invention.
Figure 14:
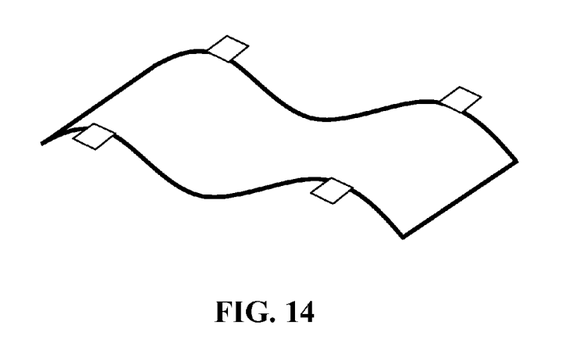

FIG. 13 shows how pivotable mounting by the clips can allow for a preferred mode of deflection. FIG. 14 shows a more rigid mounting without clipping. FIG. 14 shows that rigid mounting may promote a different type of module deflection which may or may not be preferable. Thus, as seen in FIG. 13, the one-degree of motion clips can preferentially direct the deflection mode to be along the long axis of the module or along the short axis, depending on which edge of the module the clips are attached.

Figure 15:
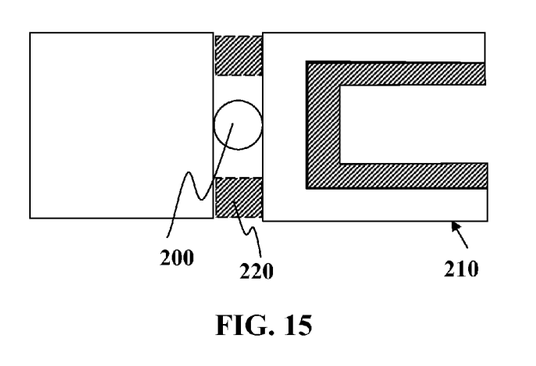
FIGS. 15-16 show module mounting supports with one degree of freedom according to various embodiments of the present invention.
Figure 16:
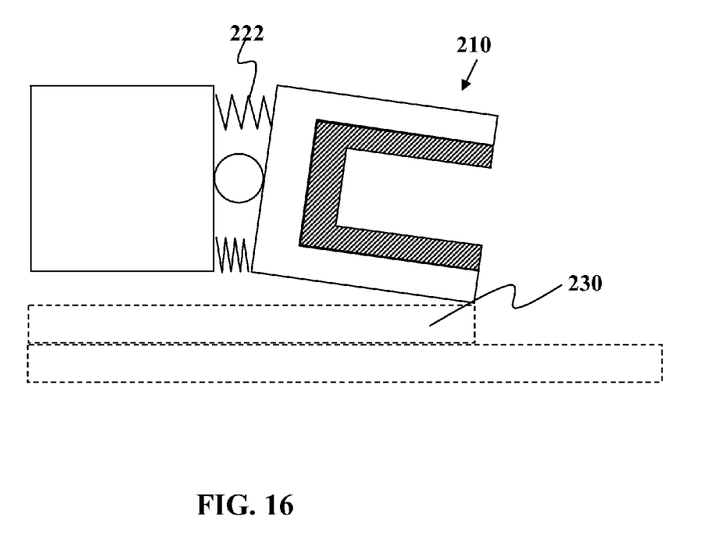

FIGS. 15 and 16 show other embodiments of clips with a structural hinge 210 that is mounted in the center, top, and or bottom of the clip 210. There may be spring elements such as but not limited to coil springs, elastomeric blocks, or other known spring devices 220 to control the deflection of the module. Bump stops 230 (shown in phantom) may also be deployed to limit a maximum deflection that is allowed. Some embodiments may be configured to provide stops which prevent maximum downward deflection or upward rotational deflection.

Figure 17:
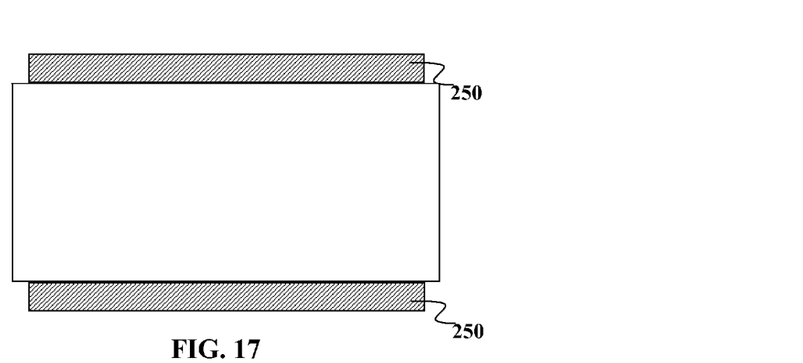
FIGS. 17-18 show embodiments of module mounts that allow for one degree of freedom which attach to only one surface or multiple surfaces of the module.
Figure 18:
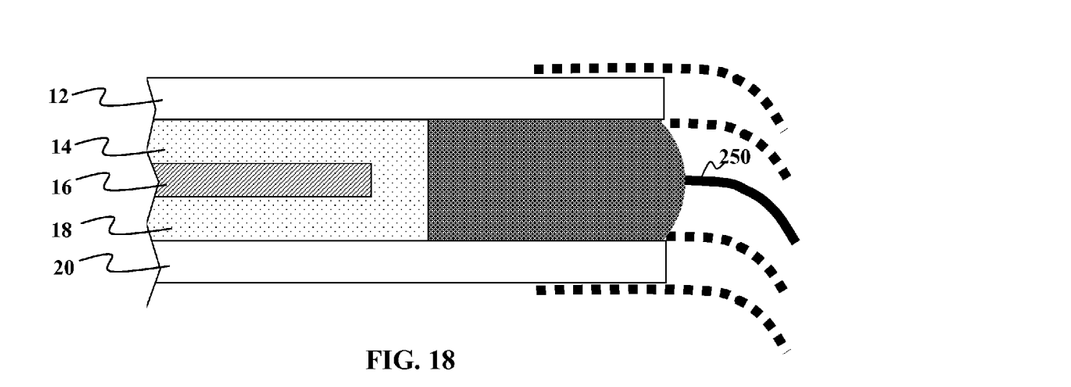

Referring now to FIGS. 17 and 18, yet another embodiment of the present invention will now be described. FIG. 17 shows a module with flaps 250 that are attached to the module. The flaps may be, but are not limited to, polymeric material, fabric, or other pliable material that may be nailed, screwed, weighed down, and/or glued to the support rail or a rooftop. The flaps 250 as seen in FIG. 18 may be attached at one or more locations on the module. FIG. 18 shows in phantom one or more other positions that may be used to attach to the module. Some modules may have more than one flap on the same side. Some may have flaps in all the configurations in FIG. 18 to allow for attachment. These flexible attachments to a rigid module allows for distributing stress along long edges of the module.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, although glass is the layer most often described as the top layer for the module, it should be understood that other material may be used and some multi-laminate materials may be used in place of or in combination with the glass. Some embodiments may use flexible top layers or coversheets. By way of nonlimiting example, the backsheet is not limited to rigid modules and may be adapted for use with flexible solar modules and flexible photovoltaic building materials. Embodiments of the present invention may be adapted for use with superstrate or substrate designs.

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A photovoltaic module mounting system comprising:
    a plurality of photovoltaic cells positioned between a transparent module layer and a backside module layer, wherein the transparent module layer has an upper surface and the backside module layer has a lower surface;
    at least one mounting bracket in contact with the upper surface and the lower surface of the module inside of the distance between the ends of the module, wherein the mounting bracket is configured to resist pullout forces inplane with the plane of the module and the bracket is configured to hold the module flat in a horizontal plane until a threshold pressure is reached upon which the bracket allows for motion in one degree of freedom such that the module deflects in a pre-determined mode of deflection, wherein the threshold pressure is at least 500 psi.

2. The module mounting system of claim 1 wherein the module is a frameless module.

3. The module mounting system of claim 1 wherein the bracket is configured to allow for rotation of the module in one degree of freedom while still resisting pullout forces inplane with the plane of the module.

4. The module mounting system of claim 1 wherein the bracket is configured to allow only for upward rotation of the module in one degree of freedom while still resisting pullout forces inplane with the plane of the module.

5. The module mounting system of claim 1 wherein the bracket is configured to allow only for downward rotation of the module in one degree of freedom while still resisting pullout forces inplane with the plane of the module.

6. The module mounting system of claim 1 wherein the bracket is configured to allow the module to flex in one axis.

7. The module mounting system of claim 1 wherein the threshold pressure is 500 psi.

8. The module mounting system of claim 1 wherein the threshold pressure is ⅛ of the module stress concentration till failure.

9. The module mounting system of claim 1 wherein the bracket comprises an internal rotatable portion attached to the module and a stationary housing within which the rotatable portion can be rotated in one degree of freedom.

10. The module mounting system of claim 1 wherein at least one portion of the bracket comprises a polymer and rotation in one degree of freedom is achieved through deformation of the polymer.

11. The module mounting system of claim 1 wherein the mode of deflection only allows for bending about a long axis of the module.

12. A photovoltaic module mounting system comprising:
    a plurality of photovoltaic cells positioned between a transparent module layer and a backside module layer, wherein the transparent module layer has an upper surface and the backside module layer has a lower surface;
    at least one mounting bracket in contact with the upper surface and the lower surface of the module inside of the distance between the ends of the module, wherein the mounting bracket is configured to resist pullout forces inplane with the plane of the module and the bracket is configured to hold the module flat in a horizontal plane until a threshold pressure is reached upon which the bracket allows for motion in one degree of freedom such that the module deflects in a pre-determined mode of deflection, wherein the threshold pressure is at least ⅛ of the module stress concentration till failure.

* * * * *